United States Patent

Avins

[15] 3,678,405

[45] July 18, 1972

[54] AMPLIFIER-LIMITER CIRCUIT WITH REDUCED AM TO PM CONVERSION

[72] Inventor: Jack Avins, Princeton, N.J.

[73] Assignee: RCA Corporation

[22] Filed: Aug. 26, 1970

[21] Appl. No.: 66,921

[52] U.S. Cl. ..............................330/26, 307/237, 330/30 D

[51] Int. Cl. ..........................................................H03f 1/38

[58] Field of Search..................330/20, 26, 30 R, 130 D, 69; 307/237; 328/31; 329/134

[56] References Cited

UNITED STATES PATENTS

| | | | |
|---|---|---|---|
| 3,546,486 | 12/1970 | Jacobson | 329/134 X |
| 3,493,879 | 2/1970 | Stanley | 330/26 X |
| 3,078,377 | 2/1963 | Brunschweiger | 307/237 |
| 3,144,564 | 8/1964 | Sikorra | 330/30 D UX |
| 3,423,685 | 1/1969 | Hayes | 330/26 X |

OTHER PUBLICATIONS

Ulrick, " Differential Amplifier Uses Two IC' s" Electronics, Nov. 11, 1968, pp. 120, 121

*Primary Examiner*—Roy Lake
*Assistant Examiner*—James B. Mullins
*Attorney*—E. M. Whitacre

[57] ABSTRACT

An amplifier-limiter circuit, having a plurality of translating stages, which utilizes positive feedback to obtain an essentially constant phase delay in each translating stage from low signal wave input levels to relatively high input signal wave levels, where each translating stage goes into limiting. As each translating stage goes progressively into limiting, with stronger signal waves, the effect of the positive feedback automatically decreases.

6 Claims, 4 Drawing Figures

INVENTOR
Jack Avins
BY Martin Sachs
ATTORNEY

INVENTOR
Jack Avins
BY Martin Sachs
ATTORNEY

INVENTOR.
Jack Avins
BY Martin Sachs
ATTORNEY

AMPLIFIER-LIMITER CIRCUIT WITH REDUCED AM TO PM CONVERSION

The present invention relates to amplifier-limiter circuits and more specifically to an amplifier-limiter circuit which has a negligible phase shift from low signal wave input levels, where the device functions as an amplifier, to high signal wave input levels, where the device functions as a limiter. A plurality of amplifier-limiter stages embodying the principles of the present invention and coupled in cascade, are suitable for fabrication with integrated circuit techniques.

The term integrated circuit as used herein refers to a unitary or monolithic semiconductor structure or chip incorporating the equivalent of a network of interconnected active and passive circuit elements such as transistors, diodes, resistors, capacitors and the like. The term angle modulation as used herein, refers to a frequency or phase modulated wave or waves modulated in both frequency and phase and will henceforth be referred to as frequency modulation (FM).

Amplifier-limiter circuits are frequently utilized in the design of FM receivers, since the limiting action reduces the unwanted amplitude modulation, noise, and interference occurring on the frequency modulated carrier wave envelope. However, if the amplifier phase delay changes with the signal wave amplitude level, the amplitude modulation of the signal wave envelope may be converted to phase modulation which is then demodulated by the angle modulation detector so that the detected output may contain undesired noise or interference.

Transistor amplifier-limiters have the inherent problem of introducing a phase delay to an applied signal wave, which delay progressively decreases as each translating amplifier stage is driven into limiting. This problem is overcome by the preferred embodiment of the present invention, since a circuit incorporating the principles of the present invention has the ability to amplify both relatively low and high level signal waves with equal phase delay.

The preferred embodiment of the invention utilizes a technique of positive feedback for each translating stage to progressively reduce the phase delay introduced at low signal levels; the amount of positive feedback being substantially reduced, automatically, as the signal level increases, thus equalizing the inherent non-linear delay of the transistor amplifier.

The present invention may be incorporated in a circuit which is fabricated on an integrated circuit chip which measures approximately 80 mils by 80 mils and may be a portion of a complete FM receiver system. The integrated circuit chip may include, but is not limited to, an intermediate frequency amplifier-limiter, a frequency modulation detector, an output amplifier, a signal-to-noise or hole detector circuit, a biasing power supply, and a tuning and signal strength indicator circuit.

A complete understanding of the invention may be obtained from the following detailed description, when taken in conjunction with the accompanying drawings in which.

Figure 1:
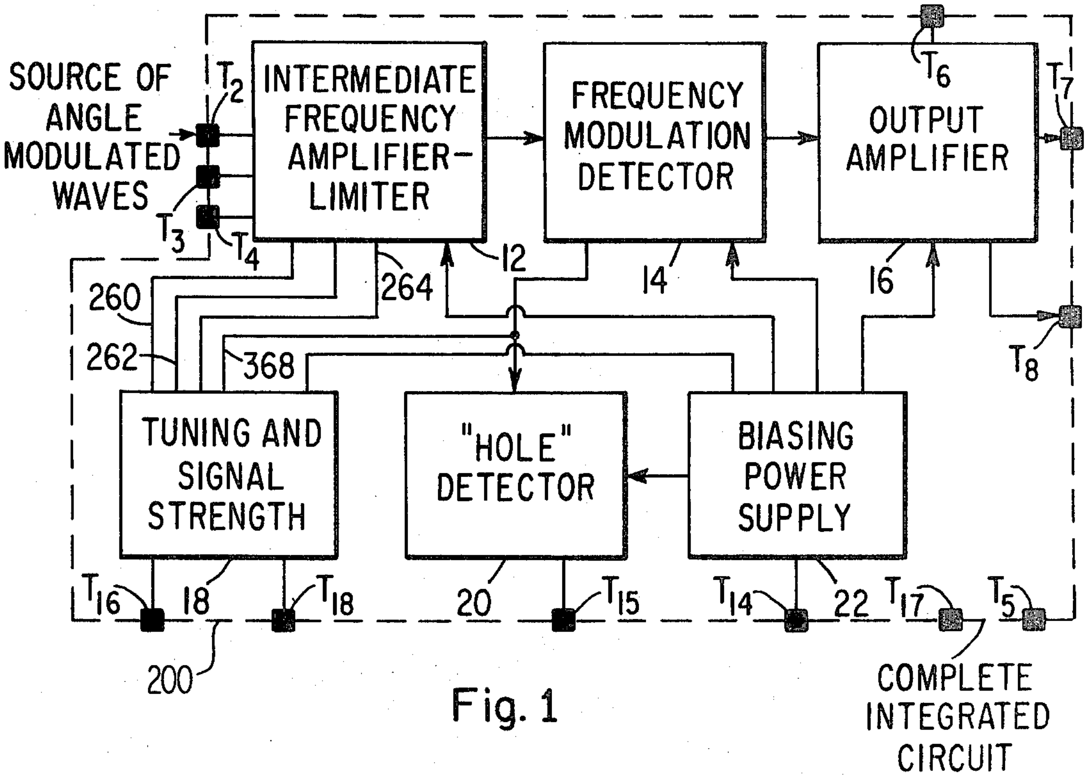
FIG. 1 is a functional block diagram of a monolithic integrated circuit chip including an amplifier-limiter embodying the principles of the present invention.

Referring to the drawings, FIG. 1 is a functional block diagram of a complete integrated circuit chip indicated by the dotted line 200 wherein angle modulated waves are introduced to the integrated circuit chip at terminals T2 and T3. The integrated circuit chip 200 has a plurality of terminals T2–T18 located about its periphery for supplying inputs to and taking outputs from the chip.

The angle modulated waves, which for the purpose of this description will be referred to as frequency modulated waves (FM), are amplified and limited by the intermediate frequency (IF) amplifier-limiter 12 which may include several translating amplifier stages.

The limiting function of IF amplifier-limiter 12 removes the amplitude modulation (AM) of the frequency modulated wave envelope. The circuitry incorporated in the IF amplifier-limiter 12 of the integrated circuit chip 200 will be described hereinafter.

Also arranged on the chip 200 is angle modulation detector 14 which is coupled to an output of IF amplifier-limiter 12 to derive the modulation components from the amplified and limited wave and apply these components to an output amplifier 16. The output signal from the output amplifier 16 is coupled to terminal T7 of chip 200 and applied to suitable utilization means not shown.

A second output signal from amplifier 16 is coupled to terminal T8 and provides an automatic frequency control (AFC) current which can be used to control the frequency of a local heterodyne oscillator, not shown, included in a signal wave receiver in which the integrated circuit chip 200 may be used. By way of example, circuitry incorporated in the output amplifier 16 may be of the type described in a concurrently filed copending application Ser. No. 66,973 (RCA 62,899) of Jack Craft filed Aug. 26, 1970 and assigned to the same assignee as this invention.

Each translating amplifier stage of IF amplifier-limiter 12 is also coupled to the tuning and signal strength circuit 18, via conductors 260, 262, and 264. The tuning and signal strength circuit 18 is further coupled to angle modulation detector 14 via conductor 368 and provides an AGC voltage at terminal T18, which may be coupled to a preceding RF or IF translating stage, not shown.

An output voltage proportional to signal strength, for utilization by a tuning indicator, not shown, is also provided by the tuning and signal strength circuit 18 and is provided at terminal T16.

Also coupled to the angle modulation detector 14 is a hole detector circuit 20 which provides a muting voltage at terminal T15 for utilization by an output amplifier.

By way of examples, the circuitry incorporated in the tuning and signal strength circuit 18 and in the hole detector circuit 20 may be of the types respectively described in concurrently filed copending applications Ser. No. 67,010 (RCA 62,897) and Ser. No. 67,009 (RCA 62,900) of Jack Avins and Jack Craft filed August 26, 1970 and assigned to the same assignee as this invention.

Also included on the integrated circuit chip 200 is the biasing power supply 22 which provides the bias voltages for proper operation of the IF amplifier-limiter 12, the angle modulation detector 14, the output amplifier 16, the tuning and signal strength circuit 18, and the hole detector circuit 20, from the potential applied at terminal T14. An example of the type of biasing power supply 22 that may be used may be found in copending patent application Ser. No. 67,010 (RCA 62,897) referred to above.

Figure 2:
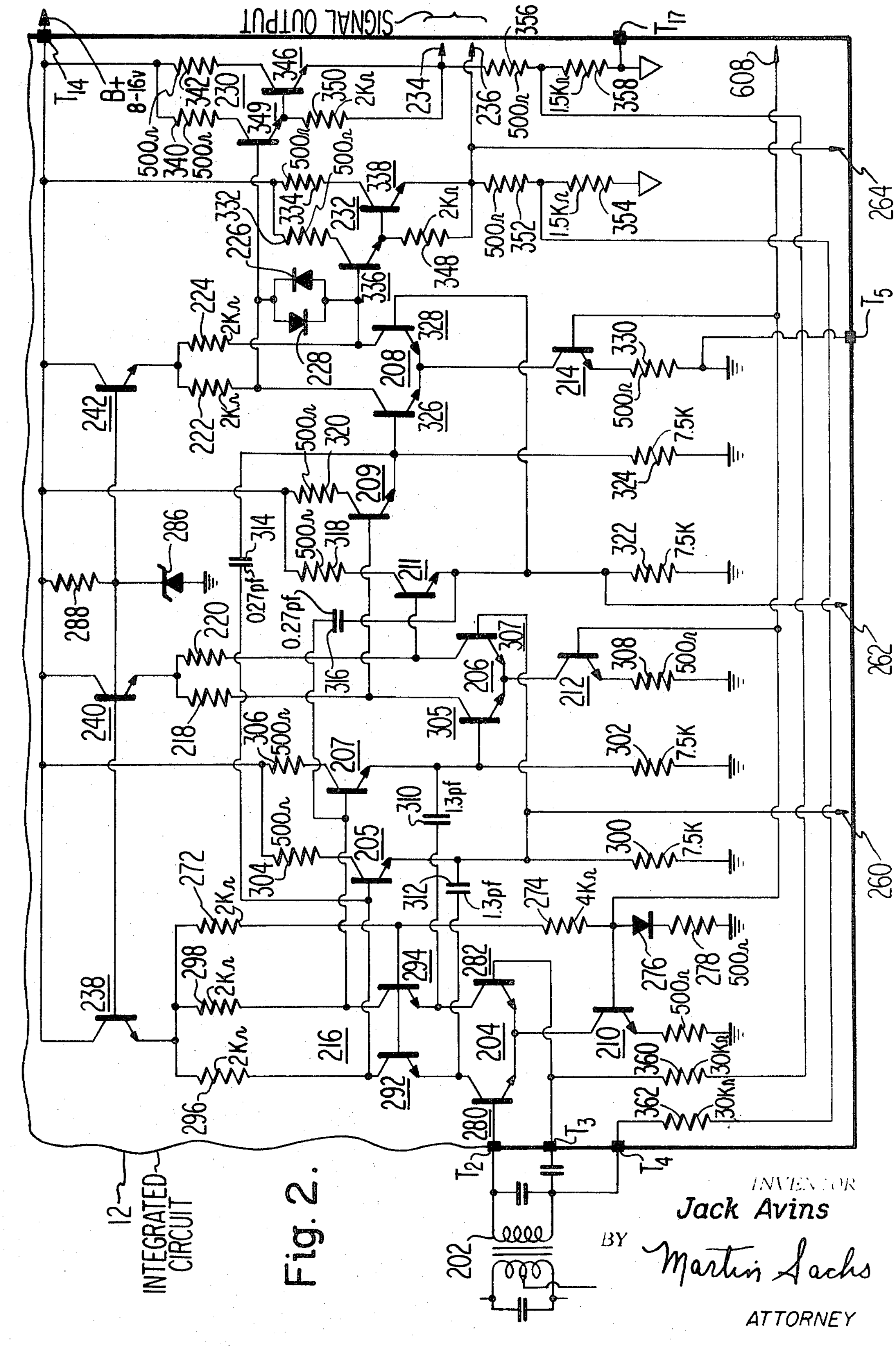
FIG. 2 is a schematic circuit diagram of the intermediate frequency amplifier-limiter shown in block form in FIG. 1.

The amplifier-limiter 12, incorporating the principles of the present invention, and associated circuitry are shown in FIG. 2.

At the right hand portion of FIG. 2 is shown terminal T17 which provides a common or ground potential contact area which is connected to various circuit ground connections on the chip. Ground terminal T17, represented by the triangular shaped symbol, is used to designate the output circuitry ground, while contact T5, represented by a conventional ground symbol, is used to designate the input circuit ground.

The input and output circuit grounds (T5 and T17) are two separate areas on the integrated circuit chip and are utilized to reduce common impedances between the input and output signals, thereby reducing interaction and cross coupling between them. A source of DC voltage for the integrated circuit chip 200 is applied to the terminal T14. This voltage may vary between 8 and 16 volts without degrading the performance of the integrated circuit chip.

The input angle modulated signal wave is introduced to the integrated circuit chip 200 at terminals T2 and T3 from the output transformer network 202 which is the output tuned circuit utilized by a preceding filter network, now shown.

The intermediate frequency amplifier-limiter 12 is one portion of a composite integrated circuit chip and is comprised of three balanced differential amplifier translating stages 204, 206, and 208 as shown in FIG. 2. Each stage is fed by a substantially constant current source including transistors 210, 212, and 214 connected to their respective commonly connected emitters.

The balanced collector load 216 for the first differential amplifier translating stage 204, which includes transistors 280 and 282, includes common base connected transistors 292 and 294, and resistors 296 and 298. The cascode arrangement of transistors 280 and 292; and 282 and 294, provides a relatively low input impedance at the emitter electrodes of transistors 292 and 294, thereby reducing the effective Miller capacitance coupling the collector electrodes to the base electrodes of transistors 280 and 282. The base electrodes of transistors 280 and 282 are connected to terminals T2 and T3 respectively, which are the differential input signal terminals.

The base of transistor 210 is coupled to a voltage divider network comprised of resistors 272, 274; diode 276; and resistor 278, connected in series from the emitter electrode of transistor 238 to the ground terminal T5. The emitter electrode of transistor 238 is approximately 4.8 volts DC above ground terminal T5, since it is one base-emitter offset (0.7 volts) below the Zener diode 286 voltage of 5.5 volts. The voltage appearing between the base of transistor 210 and ground T5 is fixed at approximately 1.0 volt and is derived from the regulated source of voltage, which includes transistor 238 and diode 286, appearing at the emitter electrode of transistor 238.

The collector of transistor 238 is coupled to T14 which is adapted to be coupled to a source of B+ voltage. Between the base of transistor 238 and ground terminal T5 is connected Zener diode 286 which has a breakdown voltage of approximately 5.5 volts. Coupled from the input B+ (T14) to the cathode of Zener diode 286 is resistor 288, which provides the Zener bias current.

Transistor 238 is connected in parallel with transistors 240 and 242 which serve to generate the DC voltages for the second 206 and third 208 differential amplifier translating stages of the intermediate frequency amplifier 12. The DC voltages appearing at the emitter electrodes of transistors 240 and 242, therefore, are the same (4.8 volts) as that appearing at the emitter electrode of transistor 238.

The voltage appearing at the emitter electrode of transistor 210 is obtained through a regulator power supply network mentioned earlier which is compensated for temperature variations by diode 276, which matches the base-emitter electrode characteristics of transistor 210. Therefore, it remains substantially constant with changes in the DC voltage at terminal T14, or changes in temperature.

The voltage appearing at the base electrode of transistor 210 is also coupled, via conductor 608 to the biasing power supply 22 (FIG. 1) where it is utilized as a reference voltage for regulator networks which supply other voltages and current used elsewhere on the integrated circuit chip 200.

The base electrodes of transistors 292 and 294 are connected to the voltage divider network at the junction of resistors 272 and 274, thereby determining their DC operating points.

The load resistors 296 and 298 of the first differential amplifier translating stage 204 are coupled respectively to the input bases of the second differential amplifier translating stage 206 by emitter follower transistors 205 and 207. The collector electrodes of transistors 205 and 207 are coupled by resistors 304 and 306 to the source of B+ at terminal T14. The emitter electrodes of transistors 205 and 207 are coupled to ground terminal T5 via resistors 300 and 302 respectively. Resistors 304 and 306 are of relatively low value and afford attenuation of harmonic frequencies generated by the steep wave fronts in the emitter follower transistors 205 and 207.

The emitter electrode of transistor 207 is coupled to the emitter electrode of transistor 294, via positive feedback capacitor 310. The emitter electrode of transistor 205 is coupled to the emitter electrode of transistor 292 via positive feedback capacitor 312.

The second differential amplifier translating stage 206 includes transistors 305 and 307 and load resistors 218 and 220 respectively. The emitter electrodes of transistors 305 and 307 are coupled to a constant current source which includes transistor 212 and resistor 308. The base electrode of transistor 212 is connected to conductor 608 which is coupled to the 1.0 volt reference point on the divider network mentioned earlier, and sets the operating bias current for the second differential amplifier translating stage 206, which is the same as operating bias current for the first stage 204.

The load resistors 218 and 220 of the second stage are coupled, respectively, through emitter follower transistors 209 and 211 to the input base electrodes of the third differential amplifier translating stage 208. The emitter electrode of transistor 209 is coupled to the collector electrode of transistor 292 by positive feedback capacitor 314. The emitter electrode of transistor 211 is coupled to the collector electrode of transistor 294 by positive feedback capacitor 316.

The collector electrodes of transistors 209 and 211 are coupled to the B+ terminal T14 by resistors 318 and 320, respectively, which are of a relatively small value. The emitter electrodes of transistors 211 and 209 are coupled to ground terminal T5, via resistors 322 and 324, respectively.

The third differential amplifier translating stage 208 includes transistors 326 and 328 and load resistors 222 and 224. The emitter electrodes of transistors 326 and 328 are coupled to a constant current source which includes transistor 214 and resistor 330. Resistor 330 is coupled from the emitter electrode of transistor 214 to the ground terminal T5.

The base electrode of transistor 214 is connected to conductor 608 which is coupled to the 1.0 volt reference voltage source at the base electrode of transistor 210, mentioned earlier, and sets the current supplied by constant current source 214, as in constant current sources 210 and 212, described earlier.

Load resistors 222 and 224 couple the collector electrodes of transistors 326 and 328, respectively, to a source of positive voltage which appears at the emitter electrode of transistor 242. The collector electrodes of transistors 326 and 328 are coupled together by diodes 226 and 228 which are connected in parallel and are polarized for current flow in opposite directions.

Connecting the diodes 226 and 228 in this manner enables the gain of the third stage 208 to be relatively high while still providing limiter action, since the diodes limit the peak-to-peak voltage swing to approximately 1.4 volts.

The load resistors 222 and 224 of the third translating stage are coupled to the Darlington connected amplifiers 230 and 232. Darlington amplifier 232 is of the conventional type and includes resistors 332, 334, and 348; and transistors 336 and 338. Resistors 332 and 334 couple the collector electrodes of transistors 336 and 338, respectively, to the source of B+ (T14).

Similarly, Darlington amplifier 230 includes resistors 340, 342, and 350; and transistors 346 and 349. Resistors 340 and 342 are coupled from the collector electrodes of transistors 349 and 346, respectively, to the source of B+ (T14). The emitter electrodes of transistors 346 and 338 are coupled to utilization means (not shown) via output points 234 and 236 respectively.

Between output point 236 and ground terminal T17 is connected a resistor divider network including resistors 352 and 354. Between output point 234 and ground terminal T17 a second divider network comprised of resistors 356 and 358 is connected. The junction of resistors 352 and 354 is coupled through resistor 362 to terminal T4 then through a direct current path afforded by a coil within filter 202 and terminal T2 to the base electrode of transistor 280.

The junction of resistors 356 and 358 is coupled through the resistor 360 to terminal T3 which is also coupled to the base electrode of transistor 282. This DC feedback to he base electrodes of transistors 280 and 282 stabilizes the operating point of the first differential translating amplifier 204 and insures symmetrical operation.

In operation, a push-pull signal wave is coupled from the filter 202 which are included in the cascode circuit described above. The cascode input circuit reduces the effect of the Miller capacitance, thereby raising the input impedance of the first differential amplifier translating stage 204 and maintaining it more nearly constant as the stage goes into limiting.

The signal wave appearing at the collector electrodes of transistors 292 and 294 has been delayed in phase in passing through transistors 280, 292 and 282, 294. The signal wave is then coupled through emitter follower transistors 205 and 207 to the base electrodes of transistors 305 and 307, respectively, of the second differential amplifier stage 206 with a minimal amount of additional phase shift. The amount that the signal wave is shifted is a function of the amplitude of the signal wave.

Positive feedback capacitors 310 and 312 couple the signal wave back to the emitter electrodes of transistors 294 and 292, respectively, in-phase with the original signal appearing there. This positive feedback steepens the leading edge of the wave, thereby reducing the delay of the translating stage, when it is operating in its linear amplifying region.

The positive feedback capacitors 310 and 312 are chosen to compensate for the phase lag through the first translating stage 204 at low signal wave levels so that it is equal to the phase lag through the stage at high signal wave levels and are typically in the order of 1.3 picofarads. The gain around the feedback path is maintained less than unity so that no oscillations will occur.

As the first translating stage 204 approaches its limiting level, the effect of the positive feedback is progressively diminished because the gain of the stage is progressively reduced as it approaches limiting, e.g., the input signal to the stage increases but the output stays constant. Thus, the positive feedback capacitors have their maximum effect for small signal waves, where they substantially reduce the delay through the first stage, and a negligible effect when the input signal waves increase to the level where the first stage is in full limiting and the phase delay is minimized.

In the first translating stage 204, the positive feedback is coupled to the emitter electrodes of transistors 292 and 294 in order not to disturb the high input impedance at input terminals T2 and T3.

Further use of the principles of the present invention is illustrated in the second translating stage 206 wherein positive feedback is utilized to couple the output back to the input through positive feedback capacitors 314 and 316. Capacitors 314 and 316 are coupled to the base electrodes of emitter follower transistors 205 and 207 rather than the base electrodes of transistors 305 and 307 because the base electrodes of transistors 205 and 207 provide a higher more convenient impedance level to which to return the feedback capacitors. Thus, a much smaller value of capacity, typically in the order of 0.27 picofarads may be used for capacitors 314 and 316, to compensate for the phase delay introduced by the second translating stage 206.

The third translating stage 208 functions in a manner similar to the second translating stage. The positive feedback capacitors are not utilized in the third translating stage, since the signal wave amplitude appearing at the base electrodes of transistors 326 and 328 has been amplified by the first and second translating amplifier stages and is therefore of sufficient amplitude to cause the wave level with the minimum usable input signal wave appearing at the input terminals T2 and T3.

The third translating stage 208 has diodes 226 and 228 coupled in parallel and polarized in opposite directions between the collector electrodes of transistors 326 and 328 to further limit the signal wave appearing at the collectors, to the threshold voltage of the diodes (approximately 0.7 volt). The signal wave therefore will be limited to a peak-to-peak amplitude of 1.4 volts for relatively large signals. For relatively small signals at the collector electrodes of transistors 326 and 328 (less than 0.7 volt peak-to-peak) the diodes 226 and 228 will not be in conduction.

The signal wave is coupled from the collector electrodes of transistors 326 and 328 to Darlington amplifiers 230 and 232 respectively, where the signal wave is translated to a lower voltage level (two base-emitter voltage offsets) and is coupled to a utilization means, not shown, at the proper impedance level.

In the absence of the positive feedback described in the present invention, a conventional amplifier-limiter will exhibit less phase delay as each stage approaches limiting. A plot of the phase delay of a typical amplifier for various input signal wave levels is shown in FIG. 3.

Figure 3:
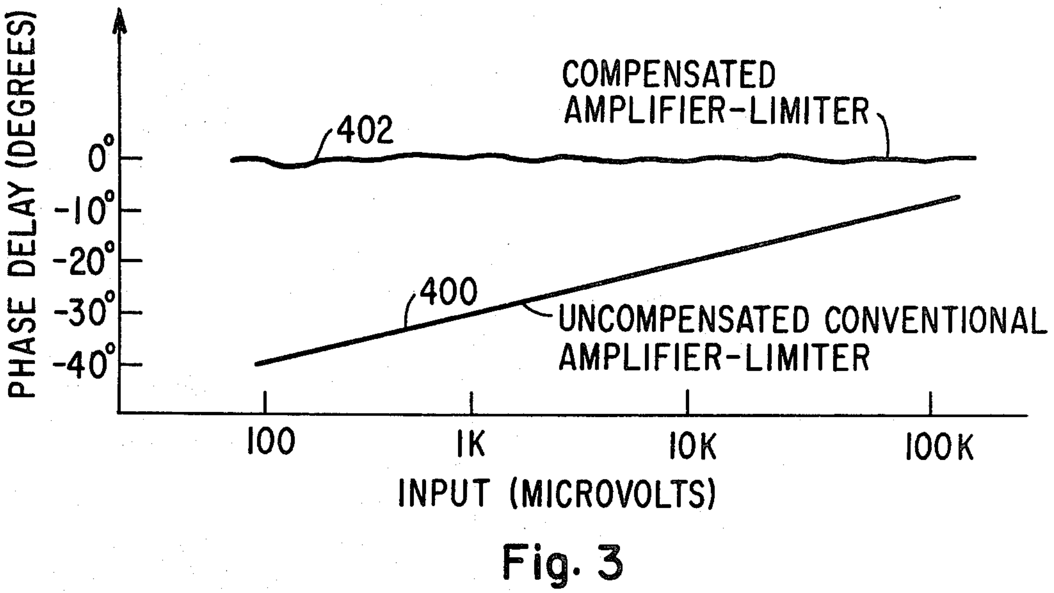
FIG. 3 is a graphical representation of phase lag versus input signal amplitude for a compensated and uncompensated amplifier-limiter.

The curve 400 of FIG. 3 shows that a difference in phase delay of approximately 40° may be expected between translating stages acting as an amplifier with a signal level of 100 microvolts at the input, and stages going into progressive limiting as the signal increases to 100,000 microvolts at the input.

The curve 402 of FIG. 3 shows the phase delay characteristic of a compensated amplifier-limiter incorporating the principles of the present invention. When fully compensated, a translating stage, as in the present embodiment of the invention, has a phase delay which remains relatively constant over a wide range of input signals. Optimum phase compensation for translating stages coupled in cascade is obtained when each successive translating stage goes into limiting at a level which results in a relatively constant delay for each stage.

The total gain of the preferred embodiment of the invention shown in FIG. 2 is approximately 70 db and it is capable of operating with an input signal wave of less than 10 microvolts rms, yielding an output signal of approximately 0.03 volts rms which is coupled to a utilization means such as the angle modulation detector 14 (FIG. 1).

It is also to be noted that in order to reduce undesirable feedback between the stages in the present embodiment, the B+ of each translating stage 204, 206, and 208 is fed by a separate regulator transistor 238, 240 or 242 respectively, which uses the DC input voltage coupled between terminals T14 and ground to provide a regulated voltage of approximately 4.8 volts DC.

An additional output signal wave is obtained from the emitter follower transistor 205 at point 260, the emitter follower transistor 211 at point 262, and the emitter electrode of transistor 338 at point 264 and is coupled to the tuning and signal strength circuit 18 (FIG. 1) located elsewhere on the integrated circuit chip.

Figure 4:
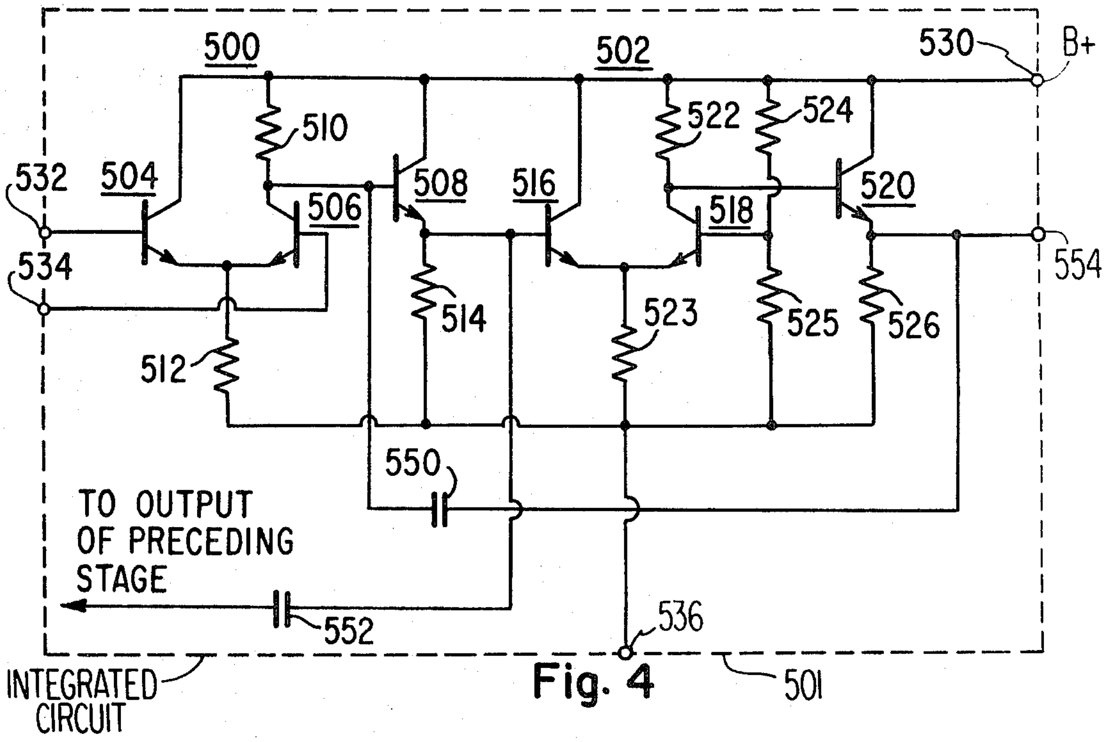
FIG. 4 is a schematic circuit diagram of a second embodiment of an amplifier-limiter utilizing the principles of the present invention.

Referring now to FIG. 4, wherein is shown a balanced differential translating amplifier that has a single ended output and incorporating the principles of the present invention. The differential translating amplifier of FIG. 4 includes two translating stages 500 and 502 and may be incorporated on an integrated circuit chip 501. The first translating stage 500 includes transistors 504, 506 and 508; and resistors 510, 512, and 514. The second translating stage 502 includes transistors 516, 518 and 520; and resistors 522, 523, 524, 525 and 526.

Resistors 512 and 523 represent the common emitter current source for stages 500 and 502. The input signal is coupled to the base electrodes of transistors 504 and 506, via terminals 532 and 534. The positive feedback capacitor 552 is coupled from the emitter electrode of transistor 508 to the input of the same stage via the output of the preceding stage while positive feedback capacitor 550 is coupled to the base electrode of transistor 516 (input) of the same stage (last) via emitter follower transistor 508. The output of the amplifier is obtained between the emitter electrode of transistor 520, which is coupled to terminal 554, and ground terminal 536.

By applying the positive feedback according to the principles as set forth in the present embodiment of the invention, the phase of a signal wave appearing at the output of each translating stage is advanced while the translating stage is in its linear amplifying range. As the translating stage is driven into limiting, the gain of the stage is progressively reduced, consequently, the effect of the feedback is also reduced.

As a result, by selecting the proper value of feedback capacitance, it is possible to compensate for the delay of each translating stage due to signal wave amplitude variations which introduce distortion in a manner such that an essentially constant delay characteristic may be obtained over the usable input signal wave amplitude range. With a substantially constant phase delay for the complete signal wave amplitude range, no phase delay resulting in distortion is introduced. Therefore, the conversion of amplitude variations to phase variations is substantially eliminated.

Thus, there has been disclosed a technique for obtaining a phase compensated amplifier (negligible AM to phase modulation conversion) which utilizes a typically small capacitance to introduce positive feedback, suitable for fabrication on a monolithic integrated circuit chip. The value of feedback capacitance typically being small, in the order of 1.0 picofarad, makes it suitable for using this technique in monolithic integrated circuit amplifier-limiters.

What is claimed is:

1. An amplifier-limiter circuit comprising:

amplifying means for providing substantially linear amplification at relatively low input signal wave levels and providing limiting at relatively high input signal wave levels, said amplifying means comprising first and second transistors having emitter, base, and collector electrodes, the collector electrodes of said first and second transistors being coupled to a first terminal adapted for coupling to a source of operating potential, the base electrode of at least said first transistor being coupled to an input terminal, said input terminal being adapted for connection to a source of angle modulated waves, the collector electrode of said second transistor being coupled to a signal output terminal, and current supplying means coupled between the emitter electrodes of said first and second transistors and a second terminal for providing a relatively constant current, said amplifying means tending to introduce, between said input and output terminals, a phase delay which varies as a function of applied signal level; and capacitive positive feedback means coupling a portion of said angle modulated wave from said output terminal to said input terminal for providing a substantially fixed phase shift through said amplifying means from relatively low to relatively high input signal wave levels.

2. An amplifier-limiter circuit according to claim 1 wherein said positive feedback means comprises:

a third transistor, having emitter, base, and collector electrodes, the collector electrode of said third transistor being coupled to said first terminal, the base electrode of said third transistor being coupled to said collector of said second transistor, the emitter electrode of said third transistor being coupled to one of said base electrodes of said first and second transistors by means including a capacitor.

3. An amplifier-limiter circuit according to claim 2, wherein said amplifying means further comprises:

a fourth transistor, having emitter, base and collector electrodes, the collector electrode of said fourth transistor being coupled to said first terminal, the base electrode of said fourth transistor being coupled to the collector electrode of said first transistor, and the emitter electrode of said fourth transistor being coupled to a second output terminal, said second terminal, and being coupled to the base electrode of said second transistor by means including a capacitor.

4. An amplifier-limiter circuit comprising:

a. first and second transistors having emitter, base, and collector electrodes;
b. current means, coupled between the emitter electrodes of said first and second transistors and a first terminal, for providing a substantially constant current;
c. means coupled to the base electrodes of said first and second transistors for providing differentially related angle modulated waves to be translated therethrough;
d. third and fourth transistors having emitter, base, and collector electrodes, the emitter electrodes of said third and fourth transistors being respectively coupled to the collector electrodes of said first and second transistors, the collector electrodes of said third and fourth transistors being coupled to a second terminal adapted to be connected to a source of operating potential, the base electrodes of said third and fourth transistors being coupled to a third terminal adapted to be connected to a source of operating bias potential; and
e. fifth and sixth transistors having emitter, base, and collector electrodes, the collector electrodes of said fifth and sixth transistors being coupled to said second terminal, the base electrodes of said fifth and sixth transistors being respectively coupled to the collector electrodes of said third and fourth transistors, the emitter electrode of said fifth transistor being coupled to said first terminal and to a first output terminal, said emitter electrode of said fifth transistor also being coupled by means including a capacitor to the collector electrode of said first transistor, the emitter electrode of said sixth transistor being coupled to said first terminal and to a second output terminal, said emitter electrode of said sixth transistor also being coupled by means including a capacitor to the collector electrode of said second transistor.

5. An amplifier-limiter circuit comprising:

amplifying means, having input and output terminals, for providing substantially linear amplification at relatively low input signal wave levels and providing limiting at relatively high input signal wave levels, said amplifying means comprising first and second transistors having emitter, base, and collector electrodes, the collector electrodes of said first and second transistors being coupled to a first terminal adapted to be connected to a source of operating potential, the base electrodes of said first and second transistors being coupled to said input terminals, and current supplying means coupled between the emitter electrodes of said first and second transistors and a second terminal, for providing a substantially constant current;

means coupled to the input terminals of said amplifying means for providing differentially related angle modulated waves; and positive feedback means coupling a portion of said angle modulated waves from said output terminals to said input terminals for providing a substantially fixed phase shift through said amplifying means from relatively low to relatively high input signal wave levels, said feedback means comprising third and fourth transistors having emitter, base, and collector electrodes, said collector electrodes being coupled to said first terminal, said base electrodes of said third and fourth transistors being coupled to the collector electrodes of said first and second transistors; the emitter electrodes of said third and fourth transistors being coupled to the base electrodes of said second and first transistors respectively, by means including a capacitor.

6. An amplifier-limiter circuit according to claim 5 wherein said means coupling the emitter electrodes of said third and fourth transistors to the base electrodes of said second and first transistors, respectively, further includes base and emitter junctions of fifth and sixth transistors.

* * * * *

UNITED STATES PATENT OFFICE
CERTIFICATE OF CORRECTION

Patent No. 3,678,405 Dated July 18, 1972

Inventor(x) Jack (NMN) Avins

It is certified that error appears in the above-identified patent and that said Letters Patent are hereby corrected as shown below:

Column 3, line 6, "now shown" should read -- not shown--.
Column 5, line 7, "he base" should read -- the base --;
Column 5, line 12, should read -- filter 202 to the base electrodes of transistors 280 and 282 which are included in the cascode circuit described --.

Signed and sealed this 13th day of February 1973.

(SEAL)
Attest:

EDWARD M.FLETCHER,JR.
Attesting Officer

ROBERT GOTTSCHALK
Commissioner of Patents

FORM PO-1050 (10-69)
3530 6/72

USCOMM-DC 60376-P69
U.S. GOVERNMENT PRINTING OFFICE 1969 O-366-334